US008816614B2

(12) United States Patent
Barth

(10) Patent No.: US 8,816,614 B2
(45) Date of Patent: Aug. 26, 2014

(54) DIAGNOSIS OF OVER-CURRENT CONDITIONS IN BIPOLAR MOTOR CONTROLLERS

(75) Inventor: Martin Barth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 249 days.

(21) Appl. No.: 13/248,586

(22) Filed: Sep. 29, 2011

(65) Prior Publication Data

US 2013/0083434 A1 Apr. 4, 2013

(51) Int. Cl.
*H02P 7/29* (2006.01)
*H02P 6/12* (2006.01)

(52) U.S. Cl.
USPC ...... 318/278; 318/447; 318/599; 318/400.21; 318/400.22; 318/400.26; 318/400.27; 318/400.29; 318/432; 318/434; 323/277; 323/284; 323/278

(58) Field of Classification Search
USPC ............. 318/599, 400.21, 400.22, 400.26, 318/400.27, 400.29, 278, 277, 445, 423, 318/434; 361/5, 44, 45, 78, 79, 82, 84, 87, 361/63, 31, 93.1, 93.7, 93.9, 100; 363/26, 363/41; 323/277, 284; 335/18
See application file for complete search history.

(56) References Cited

U.S. PATENT DOCUMENTS

| 4,710,686 A | * | 12/1987 | Guzik | 318/293 |
|---|---|---|---|---|
| 5,457,364 A | * | 10/1995 | Bilotti et al. | 318/434 |
| 5,642,247 A | * | 6/1997 | Giordano | 361/31 |
| 5,825,597 A | * | 10/1998 | Young | 361/31 |
| 5,973,569 A | * | 10/1999 | Nguyen | 330/298 |
| 7,023,152 B2 | * | 4/2006 | Sunaga et al. | 318/34 |
| 7,034,542 B2 | * | 4/2006 | Peterson | 324/522 |
| 7,218,120 B2 | * | 5/2007 | Shimoyama et al. | 324/523 |
| 7,403,365 B2 | * | 7/2008 | Sase et al. | 361/93.1 |
| 8,063,591 B2 | * | 11/2011 | Yamamoto | 318/280 |
| 8,084,973 B2 | * | 12/2011 | Hayashi | 318/400.22 |
| 8,098,036 B2 | * | 1/2012 | Matsunaga et al. | 318/446 |
| 2006/0038519 A1 | | 2/2006 | Nakagawa et al. | |

FOREIGN PATENT DOCUMENTS

DE 102006030594 A1 1/2008
JP 2007185027 A 7/2007

OTHER PUBLICATIONS

"DMOS Driver for Bipolar Stepper Motor," L6228, STMicroelectroncs, Sep. 2003, 26 pages.

* cited by examiner

*Primary Examiner* — Rita Leykin
(74) *Attorney, Agent, or Firm* — Slater & Matsil, L.L.P.

(57) ABSTRACT

A circuit for controlling a load current through a coil is connected to an output port of a transistor H-bridge that includes two low side transistors and two high side transistors. A current sense circuit is coupled to the H-bridge and configured to provide a representation of the load current provided by the output port. A current regulator is configured to generate a modulated signal dependent on the representation of the load current and a current set-point. The modulated signal has a duty-cycle. A gate control logic drives the individual transistors of the H-bridge on and off in accordance with the modulated signal. A direction signal provides the load current to the coil. The direction signal determines the direction of the load current. An over current detection circuit is coupled to each individual transistor and is configured to signal an over-current by providing an active over-current failure signal when a transistor current through the respective transistor exceeds a respective maximum value.

19 Claims, 3 Drawing Sheets

|  | desired direction of current | | actual cause for failure |
| --- | --- | --- | --- |
|  | $T_{HS1} \rightarrow A \rightarrow B \rightarrow T_{LS2}$ | $T_{HS2} \rightarrow B \rightarrow A \rightarrow T_{LS1}$ |  |
| detected failure | $OC_{HS1}$ | *open coil* | A shorted to GND |
| detected failure | none | $OC_{LS1}$ | A shorted to $V_{BAT}$ |
| detected failure | *open coil* | $OC_{HS2}$ | B shorted to GND |
| detected failure | $OC_{LS2}$ | none | B shorted to $V_{BAT}$ |
| detected failure | $OC_{HS1}$ or $OC_{LS2}$ or *shorted coil* | $OC_{HS2}$ or $OC_{LS1}$ or *shorted coil* | short-circuited coil |

FIG. 2   detected failures depending on the switching state of the H-bridge and the actual cause

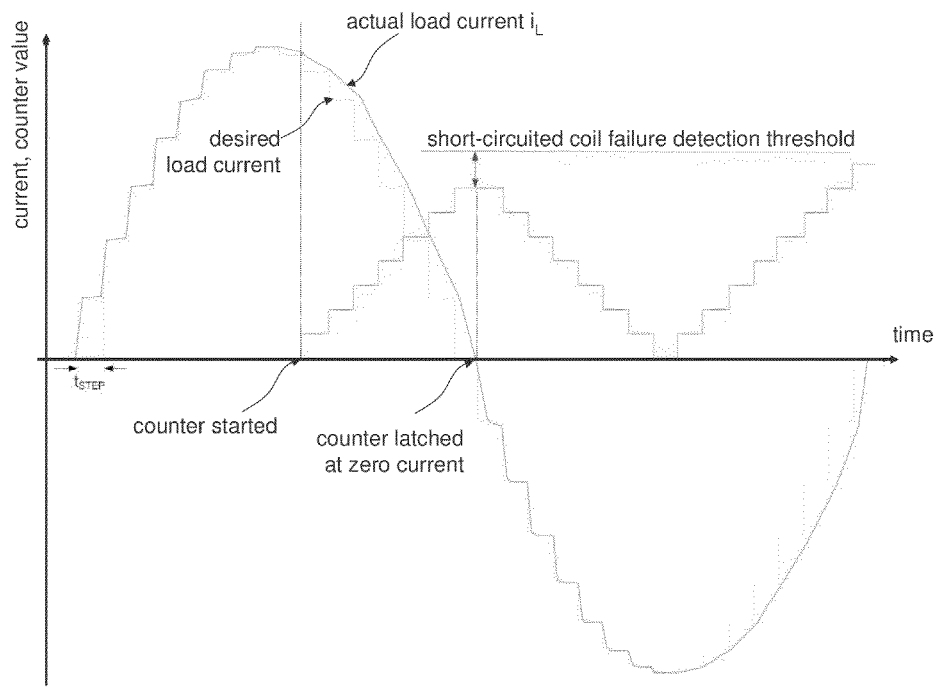

FIG. 3

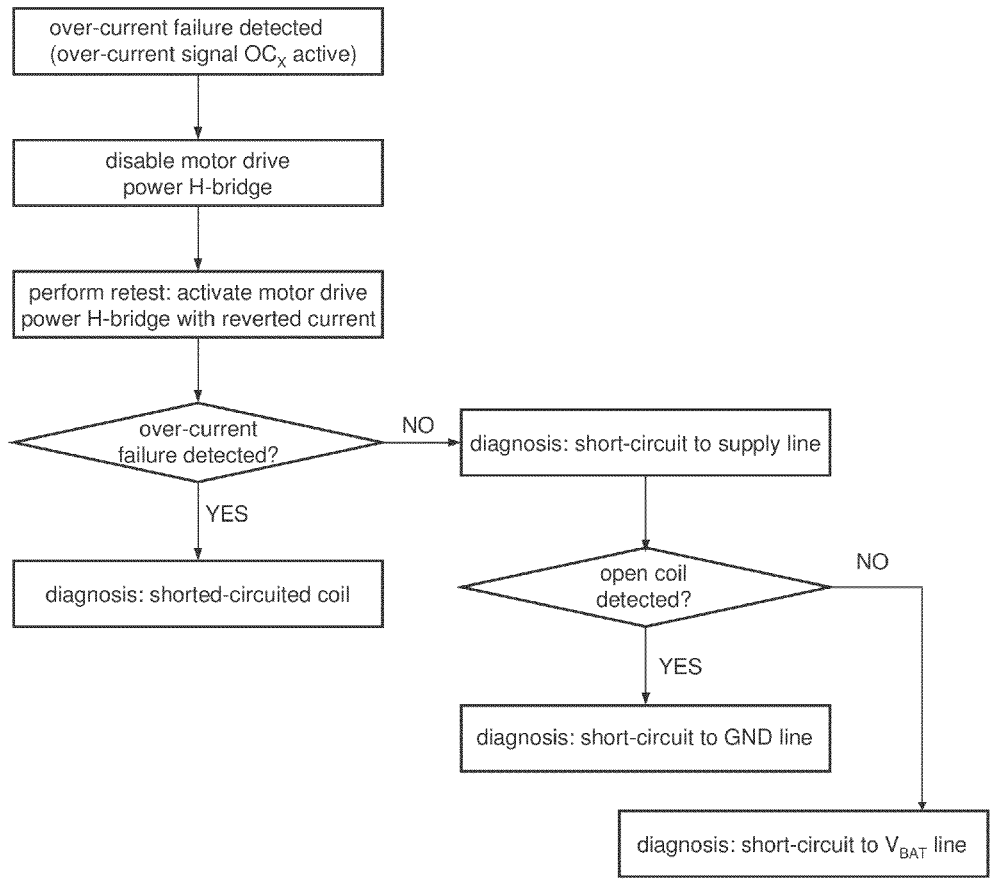
FIG. 4  flow chart

DIAGNOSIS OF OVER-CURRENT CONDITIONS IN BIPOLAR MOTOR CONTROLLERS

TECHNICAL FIELD

The invention relates to the field of over-current detection, especially to the diagnosis of particular over-current conditions in bipolar motor controllers.

BACKGROUND

A number of integrated circuits is currently available that include stepper motor controllers for various applications. One example is the L6226 DMOS driver for bipolar stepper motors of STMicroelectronics (see STM, L6228 DMOS driver, product information and data sheet, September 2003). Motor coils are typically driven using a H-bridge of power transistors. The H-bridge is composed of two half-bridges, and the coil is connected between the respective outputs of the two half-bridges. Thus the current through the coil can be controlled in both directions.

As can be seen from the datasheet mentioned above, it is common to include a kind of over-current protection into the motor controller in order to protect the controller and other components from thermal destruction due to short-circuits or the like. Upon detection of an over current the motor controller usually switches off the current and may signal an error.

In many applications, in particular in automotive applications, it may be desired to localize the cause of the over-current as this may significantly reduce the efforts which are necessary to fix the problem if over-currents occur. Thus there is a need for a motor controller which provides over-current protection that allows the localization of the cause responsible for the over-current.

SUMMARY OF THE INVENTION

The present disclosure relates to a circuit for controlling a load current through a coil connected to an output port of a transistor H-bridge including two low side transistors and two high side transistors. The circuit comprises a current sense circuit coupled to the H-bridge and configured provide a representation of the load current. A current regulator is configured to generate a modulated signal dependent on the representation of the load current and a current set-point, whereby the modulated signal has a duty-cycle. A gate control logic is provided for driving the individual transistors of the H-bridge on and off in accordance with the modulated signal and a direction signal so as to provide the load current to the coil. An over current detection circuit is coupled to each individual transistor and is configured to signal an over-current by providing an active over-current failure signal when a transistor current through the respective transistor exceeds a respective maximum value. Finally a duty cycle measuring circuit is configured to monitor the duty cycle of the modulated signal and to signal an open coil failure circuit when the duty cycle of the modulated signal exceeds a maximum duty cycle. A short-circuited coil failure may be signaled when the duty cycle of the modulated signal is equal to or falls below a minimum duty cycle.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 2 is a table listing possible measurable effects which can occur as a result from different physical failures;

FIG. 3 is a timing diagram illustrating one exemplary implementation of short-circuited coil detection; and FIG. 4 is a flow chart illustrating one example of failure detection in accordance with the present example.

DETAILED DESCRIPTION OF ILLUSTRATIVE EMBODIMENTS

Figure 1:
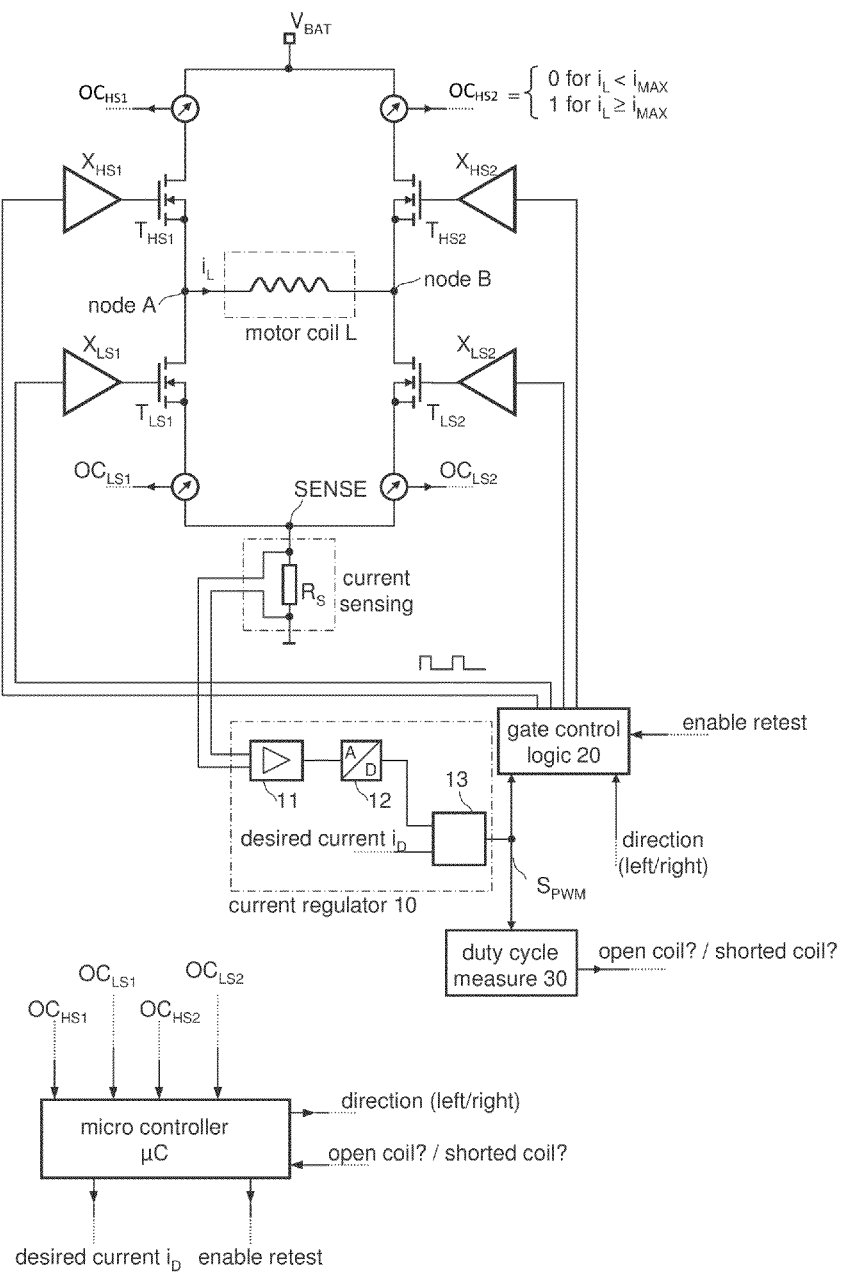
FIG. 1 illustrates in a block diagram the structure of a motor controller in accordance with one example of the invention.

As mentioned in the background section, it is common to include a kind of over-current protection into the motor controller in order to protect the controller and other components from thermal destruction due to short-circuits or the like. Upon detection of an over current the motor controller usually switches off the current and may signal an error. In many applications, in particular in automotive applications, it may be desired to localize the cause of the over-current as this may significantly reduce the efforts which are necessary to fix the problem if over-currents occur. For example, in the case where stepper motors are used in an adaptive front light system of modern vehicles, over-currents in the motor controller may result from either a short circuited motor coil (i.e., a defective motor) or from a defective cable supplying the motor in which the one of the drive lines (connecting the motor coils) are short-circuited with a battery or a ground contact. The first defect would require a change to the whole headlamp chassis of the vehicle, whereas the latter defect would only require the replacement of the cable. However, the error (over-current) signal provided by conventional motor controllers does not allow for distinguishing the cause of the over-current which would be very helpful for the electrician who has to analyze the problem by reading out the fault memory of the failure diagnosis device of the vehicle. Up to now an extensive procedure has to be done to distinguish between the two possible defects mentioned above.

FIG. 1 illustrates some components of a motor controller which are relevant for the further discussion. The motor controller includes a H-bridge composed of two half-bridges. The first half-bridge includes the transistors $T_{HS1}$ and $T_{LS1}$ connected at the half-bridge output node A, and the second half-bridge includes the transistors $T_{HS2}$ and $T_{LS2}$ connected at the half-bridge output node B. The nodes A and B form the output port of the H-bridge connecting, for example, a motor coil having an inductance L as well as an ohmic resistance $R_L$. The high side transistors $T_{HS1}$, $T_{HS2}$ are connected between the output nodes A or, respectively, B and a terminal $V_{BAT}$ receiving a corresponding supply potential, e.g., from an automotive battery. The low side transistors $T_{LS1}$, $T_{LS2}$ are connected between the output nodes A or, respectively, B and a terminal SENSE which is coupled to ground potential GND via a sense (shunt) resistor $R_S$. The voltage drop $V_S$ across the sense resistor $R_S$ represents the load current $i_L$ through the coil L (when "charging" the coil thus increasing magnetic energy stored therein) and is independent of the direction of the current $i_L$. The sensed voltage drop $V_S$ is supplied to a current regulator 10 for further processing. Each transistor $T_{HS1}$, $T_{HS2}$, $T_{LS1}$, $T_{LS2}$ is driven on and off using a driver circuit. In the present example of FIG. 1 the transistors $T_{HS1}$, $T_{HS2}$, $T_{LS1}$, $T_{LS2}$ are MOSFETs and the driver circuits are respective gate drivers $X_{HS1}$, $X_{HS2}$, $X_{LS1}$, $X_{LS2}$ whose output signals are supplied to the respective transistor gates. The driver output signals are generated in accordance with respective (binary) input signals which are provided by a gate control logic 20. The gate drivers $X_{HS1}$, $X_{HS2}$, $X_{LS1}$, $X_{LS2}$ may be configured to generate the driver signals (output signals) such that cross-conduction is prevented and defined rise and fall times of the switches load current are achieved.

The current regulator 10 receives the actual measured load current $i_L$ and provides, in accordance with a given control law, a modulated (usually a pulse width modulated, PWM) signal $S_{PWM}$ representing the desired load current. The PWM signal $S_{PWM}$ is supplied to the gate control logic 20 which generates therefrom appropriate input signals for the four gate drivers $X_{HS1}$, $X_{HS2}$, $X_{LS1}$, $X_{LS2}$ of the H-bridge. Further, a binary signal (i.e., 1 bit) is provided to the gate control logic indicating the desired direction of rotation of the motor (clockwise/counterclockwise). The control law may be implemented in a digital regulator 13. In this case the measured load current (provided by sense resistor $R_S$ and pre-amplifier 11) is digitized using an analog-to-digital converter (ADC 12). The digital regulator 13 and/or the gate control logic 20 may be implemented using designated hardware components or a general purpose programmable microcontroller executing appropriate software. Hybrid solutions (partially hardware, partially software) may be useful.

An over-current detector is coupled to each transistor of the H-bridge. Such an over-current detector may be a shunt resistor (having a low resistance to limit losses) coupled to a comparator which is triggered when the respective drain current (or collector current in case of bipolar transistors) exceeds a defined threshold. This over current threshold is usually the same for all transistors. An exceedance of the over-current threshold is signaled by setting the over-current signals $OC_{HS1}$, $OC_{HS2}$, $OC_{LS1}$, $OC_{LS2}$ to appropriate logic level (e.g., a high level of +5V wherein a low level of 0V would indicate that the current is below the threshold). Usually the respective transistor is shut down in response of a detected over-current, i.e. $OC_{HS1}=1$ will cause a shut-down of transistor $T_{HS1}$.

During normal operation the load current $i_L$ is supplied to the coil L either via the transistors $T_{HS1}$ and $T_{LS2}$ or, conversely, via the transistors $T_{HS1}$ and $T_{LS2}$. That is, two diagonally opposing transistors are switched on at a time while the other two transistors are switched off.

So when driving the coil (e.g., via transistors $T_{HS1}$ and $T_{LS2}$) three different over-current conditions might be detected, that is:
- the shut-down of a high side transistor (e.g., transistor $T_{HS1}$),
- the shut-down of a low side transistor (e.g., transistor $T_{LS2}$), or
- an over-current sensed by the sense resistor $R_S$ (which is interpreted as "shorted coil" by the current regulator 20).

In the latter case the current regulator 10 will reduce the duty-cycle of the regulator output signal $S_{PWM}$ as, the coil provides substantially no resistance and thus the regulator 10 tries to compensate for the resulting high current by reducing the regulator output signal (i.e., its duty-cycle) to a minimum. This minimum duty-cycle may, e.g., be detected by the duty-cycle measurement circuit 30. Additionally, an "open coil" failure" may be detected when the coil provides a high ohmic resistance and thus no or only a small current flows between circuit nodes A and B. An open coil may also be detected using the duty-cycle measurement circuit 30. When the duty-cycle assumes a maximum (i.e., the regulator applies maximum excitation to the coil) it can be concluded that the coil does not provide a low ohmic current path as it should. This error may also occur when the current measurement resistor is bypassed, i.e., by a short-circuit between the node A and ground.

All possible failure scenarios are summarized in the table depicted in FIG. 2. The entries last column denotes the physical cause of the failure. The entries in the second and third column, the possible effects which may occur and be detected using the circuit of FIG. 1.

Assuming a positive load current $i_L$ ($T_{HS1}$ and $T_{LS2}$ switched on, $T_{HS2}$ and $T_{LS1}$ switched off) a short-circuit to ground GND at node A will result in an active over-current signal $OC_{HS1}$, whereas a short-circuit to the battery line $V_{BAT}$ at node A can not be detected; a short-circuit to ground GND at node B will result in an "open coil" error of the regulator 10, whereas a short-circuit to the battery line $V_{BAT}$ at node B results in an active over-current signal $OC_{LS2}$; a short-circuited coil will either result in an active over-current signal $OC_{HS1}$ and/or an active over-current signal $OC_{LS2}$, and additionally in a "shorted coil" failure of the regulator 10 as explained above.

Assuming a negative load current $i_L$ ($T_{HS2}$ and $T_{LS1}$ switched on, $T_{HS1}$ and $T_{LS2}$ switched off) a short-circuit to ground GND at node B will result in an active over-current signal $OC_{HS2}$, whereas a short-circuit to the battery line $V_{BAT}$ at node B can not be detected; a short-circuit to ground GND at node A will result in an "open coil" error of the regulator 10, whereas a short-circuit to the battery line $V_{BAT}$ at node A results in an active over-current signal $OC_{LS1}$; again a short-circuited coil will either result in an active over-current signal $OC_{HS1}$ and/or an active over-current signal $OC_{LS2}$, and additionally in a "shorted coil" failure of the regulator 10 as explained above.

Which failure detection mechanism is triggered first depends on the actual detection thresholds triggering the over-current signals and the reaction time of the regulator and the duty-cycle measurement required for detecting the shorted-circuited coil failure. The detection thresholds may vary due to production tolerances.

The "open coil" failure may be triggered by the regulator when the sense resistor $R_S$ is bypassed by a short-circuit from node A or B, respectively, to ground. In this case the regulator "sees" no load current, as if no coil is present and the output port of the H-bridge is an open circuit.

In case of a detected failure (one active over-current signal $OC_{HS1}$, $OC_{HS1}$, $OC_{HS1}$, $OC_{HS1}$, an open-coil failure or a shorted-coil failure), the physical cause of this failure can not be unambiguously identified. The over current signal $OC_{HS1}$ can either result from a short-circuit between the circuit node A and ground or from a short-circuit between circuit nodes A and B (shorted coil). Consequently, a "re-test" is performed in response to a detected failure, i.e., the coil is driven again with an inverted load current. To give an example, it is assumed that the coil is initially driven with a positive load current $i_L$ (see FIG. 2, second column) and an active over-current signal $OC_{HS1}$ is detected, which may result from either a short-circuit between node A and ground GND or a short-circuited coil (i.e., a defective motor). To unambiguously identify the physical cause of the failure the coil is, as a re-test, supplied with a negative load current $i_L$ (see FIG. 2, third column). In case the regulator 10 yields an "open coil" failure, it can be unambiguously concluded that the physical cause of the malfunction is a short-circuit between node A and ground GND. In case another active over-current signal is detected during the re-test (e.g., $OC_{HS2}$), it can be unambiguously concluded that the physical cause of the malfunction is a short-circuited coil. In the first case a replacement of the cable may be suffice to solve the problem, whereas in the latter case most likely the whole motor will have to be replaced.

As mentioned above current regulator 10 will reduce the duty-cycle of the regulator output signal $S_{PWM}$, when the actual load current $i_L$ is higher than the desired load current (i.e., the load current set-point). As the regulator 10 tries to compensate for the high current (higher than the set-point) by reducing the regulator output signal (i.e., its duty-cycle) to a minimum. This minimum duty-cycle may, e.g., be detected by the duty-cycle measurement circuit 30. Thus, it is possible to detect a short-circuited coil by monitoring the duty cycle of the PWM output signal $S_{PWM}$ of the current regulator 10. However, such a failure detection strategy may lead to a "false positive" under some circumstances, i.e., a short-circuited coil is detected although it is in fact free from defects. The mechanism discussed above may be controlled by the micro controller μC illustrated in FIG. 1. It should be noted that the function provided by the current regulator 10, the duty-cycle measurement circuit 30 and the gate control logic may be implemented in the micro controller μC using appropriate software. However, a hybrid implementation using partially software (executed by the micro controller μC) and partially dedicated hardware may be employed alternatively.

FIG. 3 illustrates a situation in which the actual load current $i_L$ is too high and thus the regulator generates a PWM signal $S_{PWM}$ of a minimum duty cycle during normal operation. FIG. 3 illustrates the desired load current $i_L$ as a stepwise increasing and decreasing curve (current set-points) which approximates a sinusoidal function. While the current set-point is increasing the current regulator 10 causes the actual current $i_L$ to track the set-point. However, when the set-point is decreasing it may happen that the coil current $i_L$ can not be reduced fast enough so as to follow the set-point and, as a consequence, the regulator will reduce the duty cycle of the PWM output signal $S_{PWM}$ in the same way as it would occur for a short-circuited coil. This is a result of the fact that the current controller 10 is not able to invert the current direction (within one time step) but only regulate the current down to (almost) zero. As a result, the duty-cycle measurement circuit 30 "sees" a short-circuited coil (due to duty-cycles of almost zero) although the coil operates correctly and is free of defects.

To distinguish such a situation from a coil which is actually defective and short-circuit nodes A and B (see FIG. 1), a failure counter is provided and a short-circuited coil is only signaled when the failure counter value exceeds a pre-defined failure detection threshold. The counter is initialized to zero and is incremented once in a time interval $t_{STEP}$ (at the end of each time step $t_{STEP}$) during which a minimum duty cycle is detected. When, during a subsequent time step, the actual current $i_L$ approximately matches the set-point and the duty-cycle of the regulator output signal $S_{PWM}$ significantly differs from zero, the counter is decremented again. A "shorted coil" failure is only signaled when the counter value exceeds the failure detection threshold. In essence the counter may be seen as a "filter" which suppresses false positive detections of short-circuited coils by monitoring the duty cycle of the current regulator output. When the current set-point is zero (or its absolute value is close to zero, below an appropriate threshold) then a minimum duty-cycle will occur anyway and thus does not contribute to the counter value. A corresponding error flag indicating that a minimum duty-cycle has been detected is blanked or ignored in this case. Further, a counter overflow is prevented, i.e., the counter remains at zero when further decremented. A shorted-coil failure is only signaled when the counter exceeds a respective threshold (see FIG. 3, "short-circuited coil detection threshold").

The failure detection method employed by the controller is now summarized with reference to FIG. 4. As explained above, each of the four transistors ($T_{HS1}$, $T_{LS1}$, $T_{HS2}$, $T_{LS2}$) is associated with an appropriate transistor current monitoring unit so as to allow for an over-current detection at each transistor. An over-current event is signaled by a correspondingly active over-current signal $OC_X$ (whereby $X\in\{HS1, LS1, HS2, LS2\}$). The flow chart of FIG. 4 begins with the detection of an over-current indicated by an active over-current signal. For example, signal $OC_{HS1}$ is set active while the load current flows from circuit node A to node B.

As can be seen from the table in FIG. 2, an active over-current signal can not be unambiguously assigned to a physical cause. Signal $OC_{HS1}$ could have been triggered by a short-circuit between node A and ground or by a short-circuited coil. In response to the over-current signal the transistors of the H-bridge are switched off by the gate logic control 20. In order to resolve that ambiguity a re-test is performed with reverted current direction, i.e. the regulator again tries to drive the coil but this time with a reverted current direction (e.g. from node B to node A in the present example). If the retest yields another over-current shutdown (e.g. signaled by the signal $OC_{LS1}$), then it can be concluded that the H-bridge output port is short-circuited, i.e. the coil is short-circuited between nodes A and B. If the retest does not yield an over-current shutdown then it may be concluded that there is a short circuit between one coil terminal (node A or B) and one supply line (GND or $V_{BAT}$).

In the present example (active over-current signal $OC_{HS1}$, no ever-current shutdown during retest) it can be concluded that the circuit node A is short-circuited to the ground line. Additionally, it may be checked for an open coil error signal.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

Each individual feature described herein is disclosed in isolation and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. Aspects of the present invention may consist of any such individual feature or combination of features. In view of the foregoing description it will be evident to a person skilled in the art that various modifications may be made within the scope of the invention.

What is claimed is:

1. A circuit for controlling a load current through a coil connected to an output port of a transistor H-bridge comprising two low side transistors and two high side transistors, the circuit comprising:
    a current sense circuit coupled to the H-bridge and configured to provide a representation of the load current provided by the output port;
    a current regulator configured to generate a modulated signal dependent on the representation of the load current and a current set-point, the modulated signal having a duty-cycle;
    a gate control logic for driving individual transistors of the H-bridge on and off in accordance with the modulated signal and a direction signal so as to provide the load current to the coil, the direction signal determining a direction of the load current;

an over current detection circuit coupled to each individual transistor and being configured to signal an over-current by providing an active over-current failure signal when a transistor current through the individual transistor exceeds a respective maximum value, wherein the over-current failure signal indicates a cause of a failure; and a duty cycle measuring circuit configured to monitor the duty cycle of the modulated signal and to signal an open coil failure when the duty cycle of the modulated signal exceeds a maximum duty cycle.

2. The circuit of claim 1, wherein the duty cycle measuring circuit is configured to signal a shorted coil failure circuit when the duty-cycle of the modulated signal exceeds a minimum duty cycle for a number of times.

3. A circuit for controlling a load current through a coil connected to an output port of a transistor H-bridge comprising two low side transistors and two high side transistors, the circuit comprising:

a current sense circuit coupled to the H-bridge and configured to provide a representation of the load current provided by the output port;

a current regulator configured to generate a modulated signal dependent on the representation of the load current and a current set-point, the modulated signal having a duty-cycle;

a gate control logic for driving individual transistors of the H-bridge on and off in accordance with the modulated signal and a direction signal so as to provide the load current to the coil, the direction signal determining a direction of the load current; and an over current detection circuit coupled to each individual transistor and being configured to signal an over-current by providing an active over-current failure signal when a transistor current through the individual transistor exceeds a respective maximum value, wherein the over-current failure signal indicates a cause of a failure, wherein upon occurrence of an over-current failure signal, the direction signal is reverted to provide a reverted load current to the coil.

4. The circuit of claim 2, further comprising an evaluation unit configured to identify an actual cause of the open coil failure dependent on the over-current failure signal.

5. The circuit of claim 2, further comprising an evaluation unit configured to increment a counter value at an end of each time step when the minimum duty cycle is detected and to decrement the counter value if no minimum duty cycle is detected, the counting being prevented when a current set-point is zero.

6. A method for driving a coil connected to an output port of a transistor H-bridge comprising two low side transistors and two high side transistors, the method comprising:

providing a load current by appropriately driving the transistors of the H-bridge in accordance with a modulated signal having a duty cycle;

monitoring a transistor current at each transistor of the H-bridge and signaling an over-current when the respective transistor current exceeds a corresponding threshold; and when the over-current is signaled, shutting off the transistors, providing, as a re-test, an inverted load current by appropriately driving the transistors of the H-bridge, monitoring the transistor current at each transistor of the H-bridge, and, again, signaling the over-current when the respective transistor current exceeds a corresponding threshold.

7. The method of claim 6, further comprising:

measuring the load current using a current measurement circuit coupled to the H-bridge to obtain a measured load current value; and regulating the duty cycle of the modulated signal in accordance with the measured load current value and a current set-point.

8. The method of claim 7, further comprising monitoring the duty cycle of the modulated signal, and signaling an open coil failure when the duty cycle exceeds a predefined maximum duty cycle.

9. The method of claim 7, further comprising monitoring the duty cycle of the modulated signal, and signaling a short-circuited coil failure when the duty cycle reaches a predefined minimum duty cycle for a number of times.

10. A method for driving a coil connected to an output port of a transistor H-bridge comprising two low side transistors and two high side transistors, the method comprising:

providing a load current by appropriately driving the transistors of the H-bridge in accordance with a modulated signal having a duty cycle;

measuring the load current using a current measurement circuit coupled to the H-bridge to obtain a measured load current value;

regulating the duty cycle of the modulated signal in accordance with the measured load current value and a load current set-point;

monitoring the duty cycle of the modulated signal, incrementing a counter each time step when the duty cycle reaches or falls below a predefined minimum duty cycle, decrementing the counter each time step when the duty cycle remains above the minimum duty cycle, a counter modification being inhibited when the load current set-point is substantially zero; and signaling a short-circuited coil failure when the counter exceeds a respective short-circuited coil failure threshold.

11. The method of claim 10, further comprising:

monitoring a transistor current at each transistor of the H-bridge and signaling an over-current when the respective transistor current exceeds a corresponding threshold; and when the over-current is signaled, shutting off the transistors, providing, as a re-test, a reverted load current by appropriately driving the transistors of the H-bridge, monitoring the transistor current at each transistor of the H-bridge, and, again, signaling the over-current when the respective transistor current exceeds a corresponding threshold.

12. The method of claim 10, further comprising monitoring the duty cycle of the modulated signal, or signaling an open coil failure when the duty cycle exceeds a predefined maximum duty cycle.

13. The circuit of claim 1, wherein the over current detection circuit is further configured to determine whether a first high side transistor of the two high side transistors is shutdown, whether a first low side transistor of the two low side transistors is shut down, and whether an over-current has been sensed by a sense resistor.

14. The circuit of claim 1, wherein the current regulator is further configured to adjust the duty cycle of the modulated signal in accordance with the load current and a current set-point.

15. The circuit of claim 4, wherein the evaluation unit is further configured to determine whether there is a short between a first terminal of the coil to ground or between the coil and a supply potential.

16. The circuit of claim 4, wherein the evaluation unit is further configured to identify whether the actual cause of the open coil failure is a short from a first terminal of the coil to ground, a short from the first terminal of the coil to a supply potential, a short from a second terminal of the coil to ground, a short from the second terminal of the coil to the supply potential, or a short in the coil.

17. The method of claim 6, further comprising determining whether the coil is short circuited.

18. The method of claim 17, further comprising, when it is determined that the coil is short circuited, determining whether the coil is short circuited to ground or a supply potential.

19. A circuit for controlling a load current through a coil connected to an output port of a transistor H-bridge comprising two low side transistors and two high side transistors, the circuit comprising:

a current sense circuit coupled to the H-bridge and configured to provide a representation of the load current provided by the output port;

a current regulator configured to generate a modulated signal dependent on the representation of the load current and a current set-point, the modulated signal having a duty-cycle;

a gate control logic for driving individual transistors of the H-bridge on and off in accordance with the modulated signal and a direction signal so as to provide the load current to the coil, the direction signal determining a direction of the load current;

an over current detection circuit coupled to each individual transistor and being configured to signal an over-current by providing an active over-current failure signal when a transistor current through the individual transistor exceeds a respective maximum value; and a duty cycle measuring circuit configured to monitor the duty cycle of the modulated signal and to signal an open coil failure when the duty cycle of the modulated signal exceeds a maximum duty cycle.

* * * * *